(12) United States Patent
Chen et al.

(10) Patent No.: US 10,736,230 B2
(45) Date of Patent: Aug. 4, 2020

(54) CABLE MANAGEMENT ASSEMBLY

(71) Applicants:King Slide Works Co., Ltd., Kaohsiung (TW); King Slide Technology Co., Ltd., Kaohsiung (TW)

(72) Inventors: Ken-Ching Chen, Kaohsiung (TW); Shun-Ho Yang, Kaohsiung (TW); Wei-Chen Chang, Kaohsiung (TW); Chun-Chiang Wang, Kaohsiung (TW)

(73) Assignees: KING SLIDE WORKS CO., LTD., Kaohsiung (TW); KING SLIDE TECHNOLOGY CO., LTD., Kaohsiung (TW)

( * ) Notice: Subject to any disclaimer, the term of this patent is extended or adjusted under 35 U.S.C. 154(b) by 0 days.

(21) Appl. No.: 16/245,294

(22) Filed: Jan. 11, 2019

(65) Prior Publication Data

US 2020/0120829 A1    Apr. 16, 2020

(30) Foreign Application Priority Data

Oct. 12, 2018 (TW) .............................. 107136272 A

(51) Int. Cl.
| H05K 7/14 | (2006.01) |
| F16L 3/08 | (2006.01) |
| H02G 3/04 | (2006.01) |
| H02B 1/01 | (2006.01) |
| F16L 3/015 | (2006.01) |

(52) U.S. Cl.
CPC ............ *H05K 7/1491* (2013.01); *F16L 3/015* (2013.01); *F16L 3/08* (2013.01); *H02B 1/012* (2013.01); *H02G 3/0406* (2013.01); *H05K 7/1489* (2013.01)

(58) Field of Classification Search
None
See application file for complete search history.

(56) References Cited

U.S. PATENT DOCUMENTS

| 8,379,410 | B2 | 2/2013 | Kitten |
| 8,833,715 | B2 | 9/2014 | Chen et al. |
| 9,332,669 | B1 | 5/2016 | Chen |
| 9,480,182 | B2 | 10/2016 | Chen et al. |
| 9,640,961 | B2 | 5/2017 | Chen et al. |
| 9,913,397 | B2 | 3/2018 | Miwa |
| 10,051,759 | B1* | 8/2018 | Chen .................... A47B 57/545 |
| 2012/0193489 | A1* | 8/2012 | Yu ........................ H05K 7/1489 248/201 |
| 2016/0186895 | A1 | 6/2016 | Chen et al. |
| 2017/0245389 | A1* | 8/2017 | Chen ...................... F16L 3/015 |
| 2018/0054911 | A1 | 2/2018 | Chen |
| 2018/0125234 | A1* | 5/2018 | Chen ................... H05K 7/1489 |

FOREIGN PATENT DOCUMENTS

| EP | 3041329 A1 | 7/2016 |
| JP | 3187607 U | 12/2013 |

* cited by examiner

*Primary Examiner* — Xanthia C Cunningham
(74) *Attorney, Agent, or Firm* — Alan D. Kamrath; Karin L. Williams; Mayer & Williams PC

(57) ABSTRACT

A cable management assembly includes a connecting device; wherein, the connecting device includes a first part and a second part. The first part is configured to be mounted to a target object. The second part is arranged at a position for being easily operated to detach the first part from the target object.

19 Claims, 12 Drawing Sheets

CABLE MANAGEMENT ASSEMBLY

BACKGROUND OF THE INVENTION

1. Field of the Invention

The present invention relates to a cable management mechanism, and more particularly, to a cable management assembly capable of supporting a cable.

2. Description of the Prior Art

As shown in FIG. 1, a plurality of slide rail assemblies 100 are arranged on a rack 102 from top to bottom according to a predetermined specification height. Wherein, each of the slide rail assemblies 100 generally comprises a first rail 104 and a second rail 106 longitudinally movable relative to the first rail 104. The first rail 104 is mounted to a first post 102a and a second post 102b of the rack 102. The second rail 106 is configured to carry a carried object 108, such as an electronic apparatus. Wherein, a cable management assembly 110 is usually arranged behind each of the slide rail assemblies 100. The cable management assemblies are configured to support and manage electronic cables 112 behind the carried object 108.

Wherein, each of the cable management assemblies 110 is usually detachably connected to a corresponding target object (such as the first rail 104, the second rail 106, the carried object 108 or the second post 102b) through at least one connecting mechanism 114. Since an operating part 116a of an operating member 116 of the connecting mechanism 114 is arranged at a lateral side of the connecting mechanism 114, in some cases such as in a narrow space, it is not easy for a user to detach the cable management assembly 110 from the target object through the operating part 116a. During installation, since four corners of a cabinet are provided with posts to support, a lateral side of each of the posts 102a, 102b is usually arranged with a side wall 120, and a space D between the side wall 120 and the connecting mechanism 114 might be so narrow that it is not convenient for the user to extend the hand into the space D a longitudinal distance L to press the operating part 116a of the connecting mechanism 114 for detaching an end part of the cable management assembly 110 to further vacate space behind the carried object 108 to facilitate maintenance or replacement of electronic components behind the carried object 108 (the electronic device).

Therefore, it is important to develop a connecting device of a cable management assembly having an operating part convenient to operate.

SUMMARY OF THE INVENTION

The present invention relates to a cable management assembly with a connecting device convenient to operate.

According to an embodiment of the present invention, a cable management assembly comprises a first cable management arm, a second cable management arm and at least one supporting member. Each of the second cable management arm and the first cable management arm comprises a first end part and a second end part. Wherein, the first end parts of the first cable management arm and the second cable management arm are movably connected to each other. Wherein, one of the at least one supporting member, the second end part of the first cable management arm and the second end part of the second cable management arm is arranged with a connecting device Wherein, the connecting device comprises a front part and a rear part. The front part is configured to be detachably connected to a first target object, and the rear part is configured to be operated to detach the front part from the first target object.

Preferably, the at least one supporting member is configured to support one of the first cable management arm and the second cable management arm.

Preferably, the first target object is a rail.

Preferably, the other two of the at least one supporting member, the second end part of the first cable management arm and the second end part of the second cable management arm are respectively arranged with a first mounting member and a second mounting member configured to be detachably connected to a second target object and a third target object respectively.

Preferably, the second target object and the third target object are rails.

Preferably, the front part of the connecting device is arranged with an engaging member. The front part is detachably connected to the first target object through the engaging member. The connecting device comprises an operating member operatively connected to the engaging member. The operating member has an operating part arranged adjacent to the rear part of the connecting device.

Preferably, the connecting device is arranged on the at least one supporting member through a base.

Preferably, the base comprises a base part and a wall part. The base part is connected to the at least one supporting member and adjacent to one end of the at least one supporting member. The wall part is arranged vertically relative to the base part. The connecting device is pivoted relative to the wall part.

Preferably, the connecting device further comprises a mounting base. The operating member is movably mounted to the mounting base. The operating member is configured to be operated through the operating part to longitudinally move relative to the mounting base.

Preferably, the operating part of the operating member is extended beyond the rear part of the connecting device along a direction away from the front part of the connecting device.

According to another embodiment of the present invention, a cable management assembly comprises a connecting device. Wherein, the connecting device comprises a first part and a second part away from the first part, the first part is configured to be engaged with a first target object, and the second part is configured to be operated to detach the first part from the first target object.

According to another embodiment of the present invention, a cable management assembly is applicable to a first slide rail assembly and a second slide rail assembly. Each of the slide rail assemblies comprises a first rail and a second rail. The first rail is mounted to a rack, and the second rail is longitudinally movable relative to the first rail. The cable management assembly comprises a first cable management arm, a second cable management arm and at least one supporting member. Each of the second cable management arm and the first cable management arm comprises a first end part and a second end part. The first end parts of the first cable management arm and the second cable management arm are pivotally connected to each other. The second end parts of the first cable management arm and the second cable management arm are respectively arranged with a first mounting member and a second mounting member configured to be detachably connected to the first rail and the second rail of the first slide rail assembly respectively. The at least one supporting member is arranged with a connecting device. Wherein, the connecting device comprises a front part and a rear part. The front part is configured to be detachably connected to the first rail of the second slide rail assembly, and the rear part is configured to be operated to detach the front part from the first rail of the second slide rail assembly.

These and other objectives of the present invention will no doubt become obvious to those of ordinary skill in the art after reading the following detailed description of the preferred embodiment that is illustrated in the various figures and drawings.

DETAILED DESCRIPTION

Figure 2:
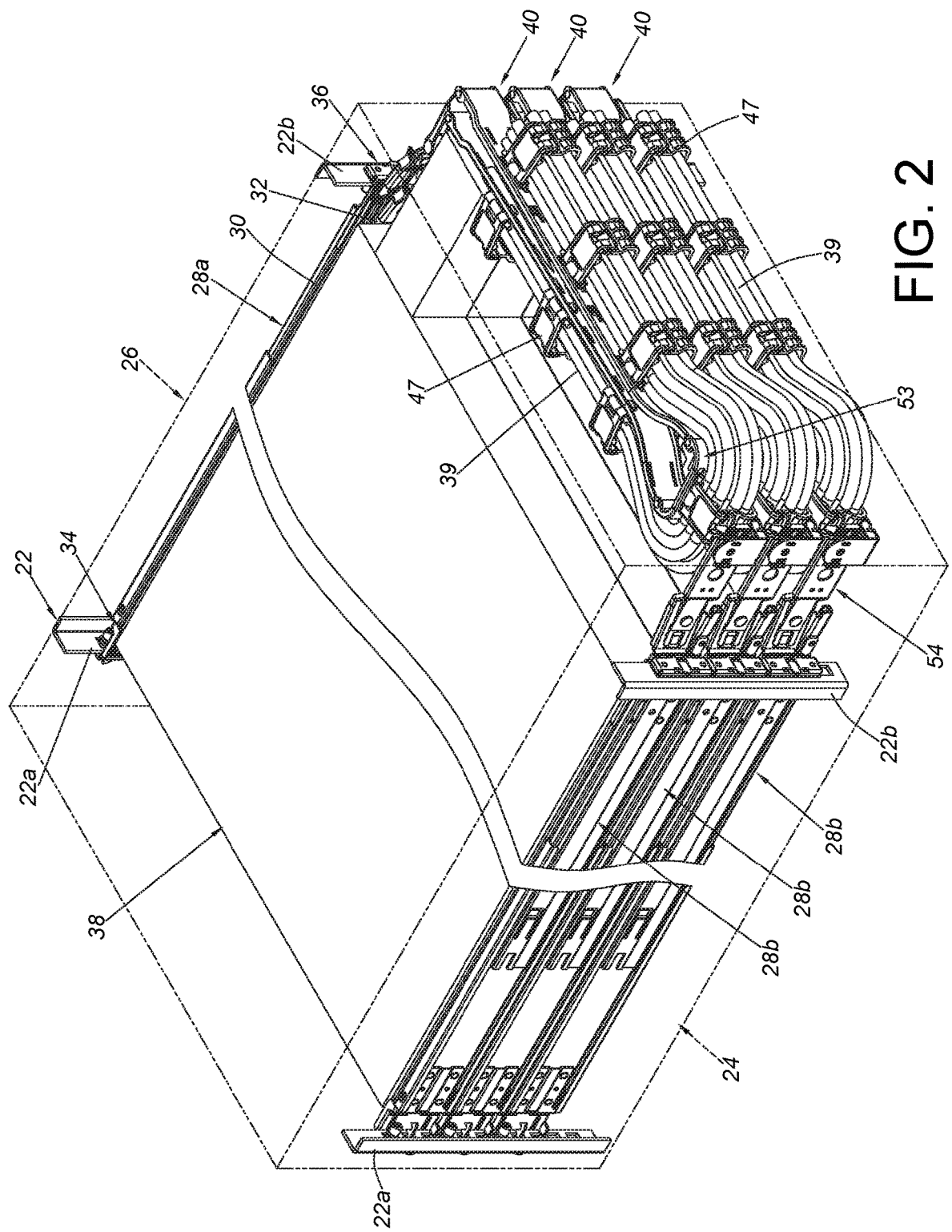
FIG. 2 is a diagram showing cable management assemblies in a first state being applied to a rack system according to an embodiment of the present invention.

As shown in FIG. 2, in a rack system, a rack 22 (or cabinet) comprises a plurality of posts, such as a pair of front posts 22a and a pair of rear posts 22b. Wherein, the rack 22 is usually arranged with a plurality of walls, such as a first wall 24 and a second wall 26 respectively arranged at two sides of the rack 22. In addition, each of a front side and a rear side of the rack 22 is provided with a door panel. In the present embodiment, the door panel is detached, such that the rack 22 is in an open state.

Moreover, the rack system comprises a plurality of pairs of slide rail assemblies arranged from top to bottom. In the present embodiment, the rack system comprises three pairs of slide rail assemblies. Each pair of slide rail assemblies comprises a first slide rail assembly 28a and a second slide rail assembly 28b (wherein, only the topmost slide rail assembly 28a is shown in FIG. 2 due to the viewing angle).

Each of the slide rail assemblies comprises a first rail 30 and a second rail 32. Wherein, the first rail 30 is mounted to the front post 22a and the rear post 22b through a first bracket 34 and a second bracket 36 respectively. On the other hand, the second rail 32 is longitudinally movable relative to the first rail 30, and the second rail 32 is configured to carry a carried object 38, such as an electronic apparatus, a drawer or the like. In the present embodiment, the carried object 38 is an electronic apparatus. The carried object 38 can be easily pushed and retracted into the rack 22 from outside of the rack 22 through the second rail 32. Wherein, since the second rail 32 of each of the slide rail assemblies is configured to carry the carried object 38, a corresponding cable management assembly 40 is provided at a rear side of the carried object 38.

Figure 3:
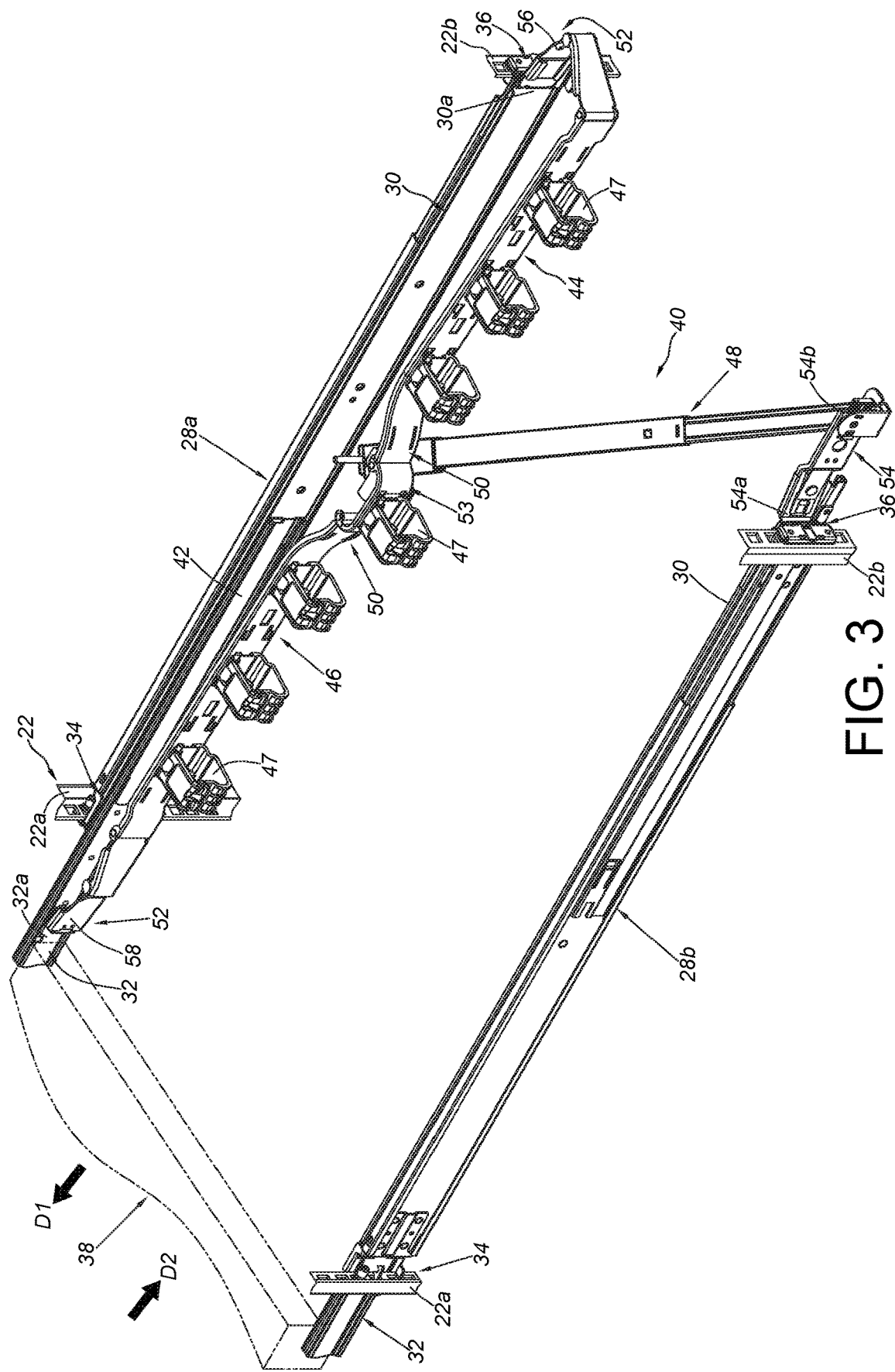
FIG. 3 is a diagram showing the cable management assembly in a second state being applied to the rack system according to an embodiment of the present invention.

As shown in FIG. 3, the cable management assembly 40 is applicable to the first slide rail assembly 28a and the second slide rail assembly 28b. Each of the first slide rail assembly 28a and the second slide rail assembly 28b comprises the first rail 30 and the second rail 32. Preferably, each of the first slide rail assembly 28a and the second slide rail assembly 28b comprises a third rail 42 movably mounted between the first rail 30 and the second rail 32. The third rail 42 is configured to extend a traveling distance of the second rail 32 being moved relative to the first rail 30 from a retracted position along a first direction D1. Wherein, the second rail 32 can also be moved relative to the first rail 30 from an extension position back to the retracted position along a second direction D2 (such as a state of the slide rail assembly shown in FIG. 2).

The cable management assembly 40 comprises a first cable management arm 44, a second cable management arm 46 and at least one supporting member 48. Wherein, each of the first cable management arm 44 and the second cable management arm 46 comprises a plurality of cable management features 47. The plurality of cable management features 47 are configured to manage cables 39 at a rear side of the carried object 38. Wherein, the cable management features 47 can be an additional components mounted to the cable management arms 44, 46; or the cable management features 47 can be integrally formed on the cable management arms 44, 46; or the cable management features 47 can be straps or ropes tied on the cable management arms 44, 46, but the present invention is not limited thereto.

Each of the second cable management arm 46 and the first cable management arm 44 comprises a first end part 50 and a second end part 52. Wherein, the first end parts 50 of the first cable management arm 44 and the second cable management arm 46 are movably connected to each other. In the present embodiment, the first end part 50 of the first cable management arm 44 and the first end part 50 of the second cable management arm 46 are pivoted relative to each other through a connecting base 53. Or, in other embodiments, the first end part 50 of the first cable management arm 44 and the first end part 50 of the second cable management arm 46 can be directly pivoted to each other. The present invention is not limited thereto.

The at least one supporting member 48 is configured to support at least one of the first cable management arm 44 and the second cable management arm 46. For example, the at least one supporting member 48 is configured to support bottoms of the first cable management arm 44 and the second cable management arm 46. Moreover, the at least one supporting member 48 can comprise single one supporting rod or two telescopic supporting rods, but the present invention is not limited thereto.

One of the at least one supporting member 48, the second end part 52 of the first cable management arm 44 and the second end part 52 of the second cable management arm 46 is arranged with a connecting device 54. In the present embodiment, the at least one supporting member 48 is arranged with the connecting device 54. On the other hand, the other two of the at least one supporting member 48, the second end part 52 of the first cable management arm 44 and the second end part 52 of the second cable management arm 46 are arranged with a first mounting member 56 and a second mounting member 58 respectively. In the present embodiment, the second end part 52 of the first cable management arm 44 and the second end part 52 of the second cable management arm 46 are respectively arranged with the first mounting member 56 and the second mounting member 58.

Furthermore, the second end part 52 of the first cable management arm 44 is configured to be detachably connected to a rear part 30a of the first rail 30 of the first slide rail assembly 28a through the first mounting member 56. For example, the rear part 30a of the first rail 30 of the first slide rail assembly 28a has a connecting feature configured to be detachably connected with the first mounting member 56. Wherein, the first mounting member 56 can be detachably connected to the connecting feature by inserting, engaging or fastening, but the present invention is not limited thereto. On the other hand, the second end part 52 of the second cable management arm 46 is configured to be detachably connected to a rear part 32a of the second rail 32 of the first slide rail assembly 28a through the second mounting member 58. For example, the rear part 32a of the second rail 32 of the first slide rail assembly 28a has a connecting feature configured to be detachably connected with the second mounting member 58. Wherein, the second mounting member 58 can be detachably connected to the connecting feature by inserting, engaging or fastening, but the present invention is not limited thereto.

Figure 4:
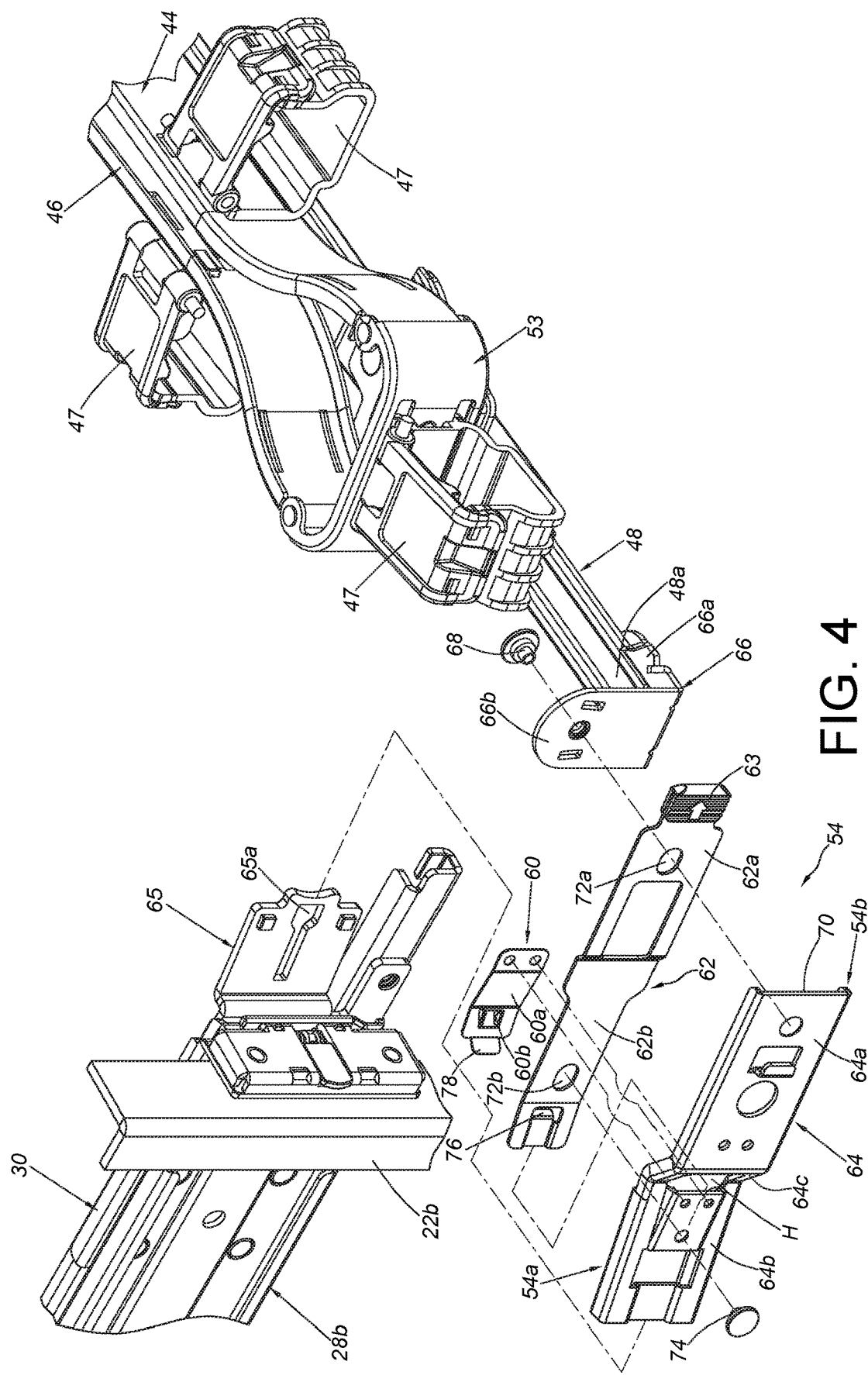
FIG. 4 is an exploded view of a connecting device of the cable management assembly configured to be connected to a target object according to an embodiment of the present invention.

As shown in FIG. 4, the connecting device 54 comprises a first part 54a and a second part 54b. The second part 54b is away from the first part 54a. In the present invention, the first part 54a is a front part, and the second part 54b is a rear part. Moreover, the first part 54a is configured to be detachably connected to a rear part of the first rail 30 of the second slide rail assembly 28b, and the second part 54b is configured to be operated to detach the first part 54a from the first rail 30 of the second slide rail assembly 28b.

Figure 5:
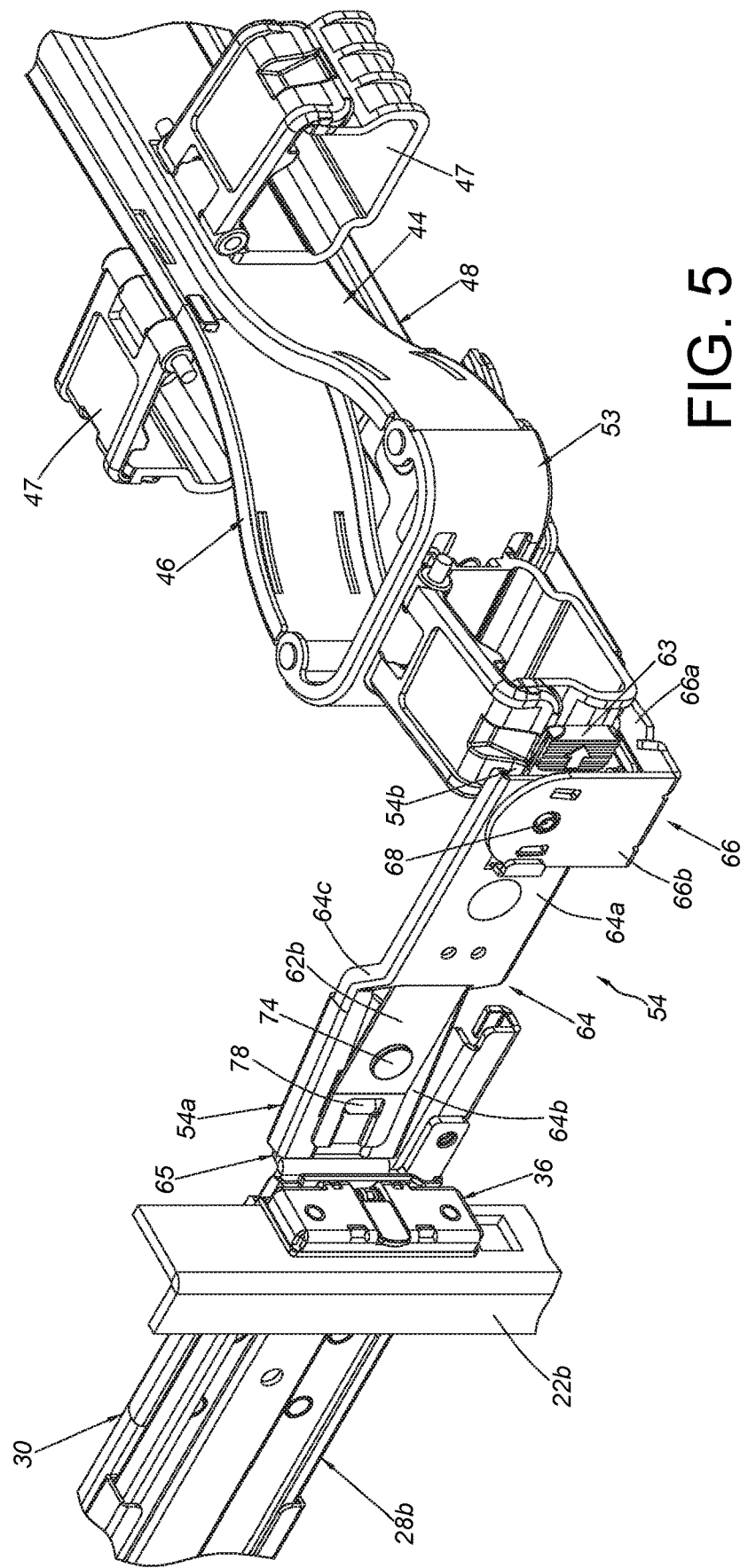
FIG. 5 is a diagram showing the connecting device of the cable management assembly configured to be connected to the target object from a viewing angle according to an embodiment of the present invention.

Specifically, as shown in FIG. 4 and FIG. 5, the connecting device 54 further comprises an engaging member 60, an operating member 62 and a mounting base 64. Wherein, the first part 54a and the second part 54b are arranged on the mounting base 64.

Figure 6:
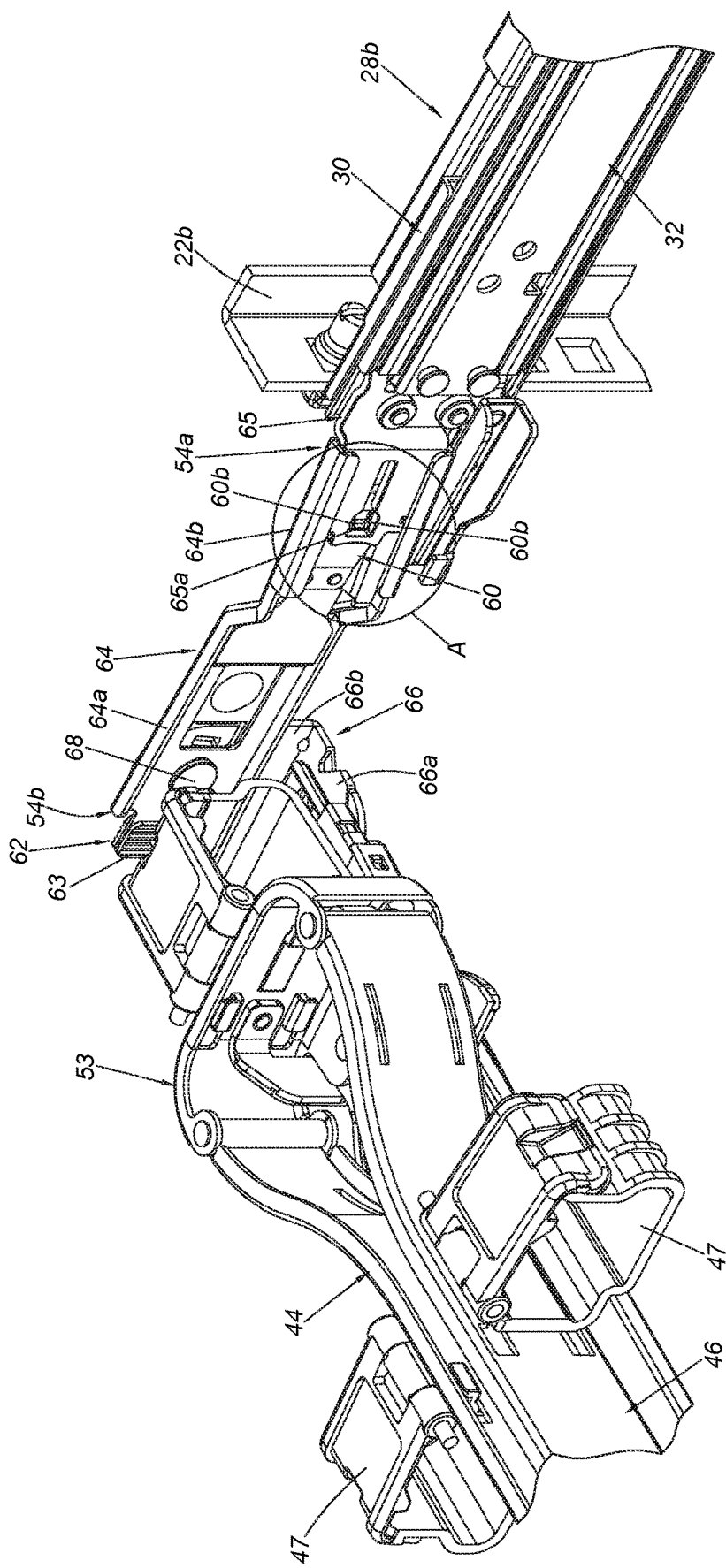
FIG. 6 is a diagram showing the connecting device of the cable management assembly configured to be connected to the target object from another viewing angle according to an embodiment of the present invention.
Figure 7:
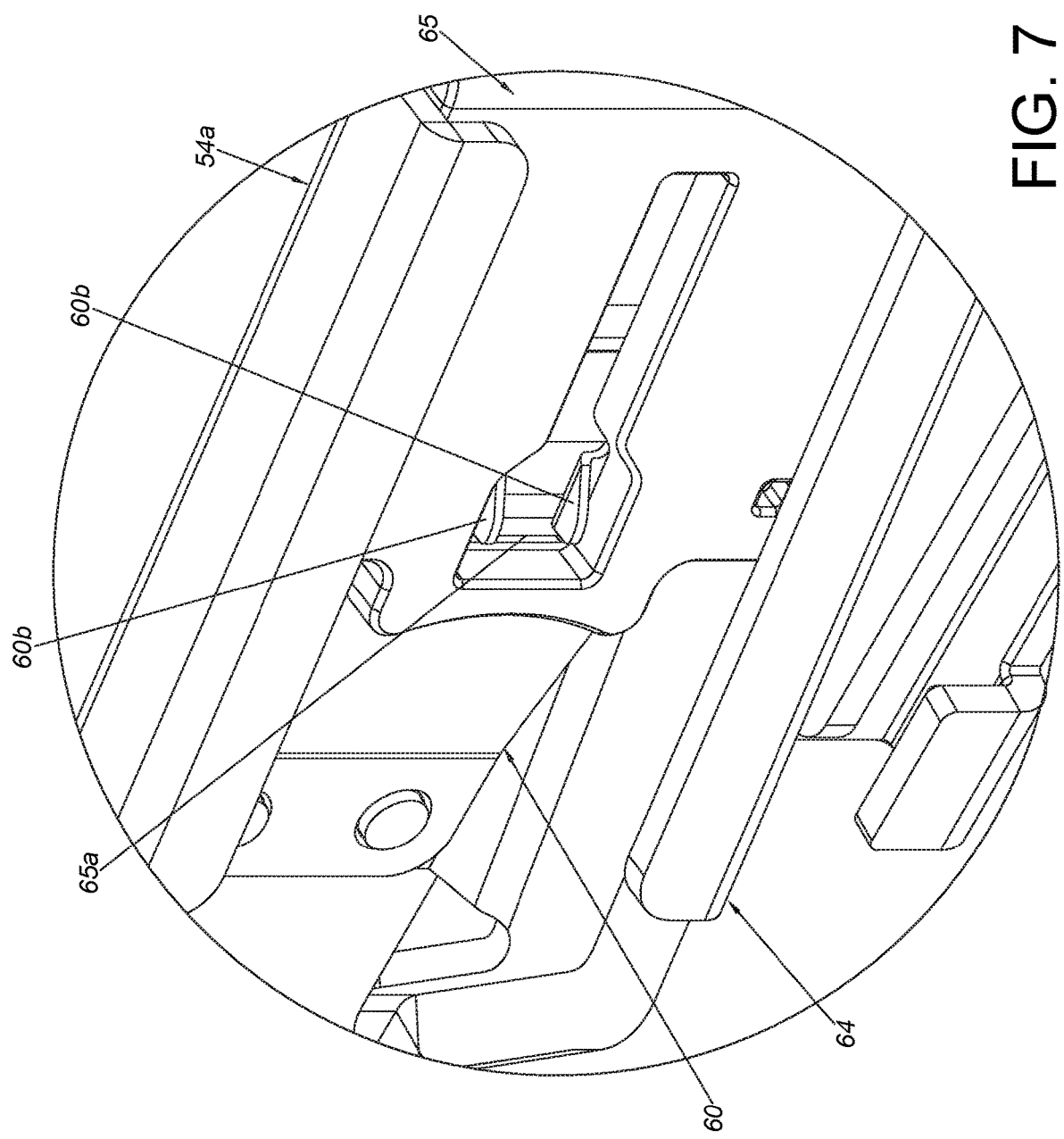
FIG. 7 is an enlarged view of an area A of FIG. 6.

The engaging member 60 is arranged on the first part 54a of the connecting device 54. Preferably, the first part 54a is detachably connected to a connecting section 65 of the rear part of the first rail 30 of the second slide rail assembly 28b through the engaging member 60. Preferably, the engaging member 60 comprises an elastic part 60a and a first structure 60b. The first structure 60b is arranged adjacent to the elastic part 60a, and the first structure 60b is configured to be engaged with a second structure 65a of the connecting section 65 (please also refer to FIG. 6 and FIG. 7). Wherein, the first structure 60b and the second structure 65a are a combination of convex and concave (hole) structures, but the present invention is not limited thereto. In the present embodiment, the first structure 60b is a protruded hook, and the second structure 65a is a hole.

The operating member 62 is operatively connected to the engaging member 60. The operating member 62 has an operating part 63 arranged adjacent to the second part 54b of the connecting device 54. Preferably, the operating part 63 is extended beyond the second part 54b of the connecting device 54 along a direction away from the first part 54a of the connecting device 54 (such as the second direction D2). Preferably, the connecting device 54 is arranged on the at least one supporting member 48 through a base 66. The base 66 comprises a base part 66a and a wall part 66b. The base part 66a is connected to the at least one supporting member 48 and adjacent to one end 48a of the at least one supporting member 48. The wall part 66b is arranged vertically relative to the base part 66a. The connecting device 54 is arranged on the wall part 66b. For example, the connecting device 54 is pivoted relative to the wall part 66b through a first shaft member 68. Preferably, the mounting base 64 of the connecting device 54 is pivoted to the wall part 66b of the base 66, and the mounting base 64 comprises a first base part 64a, a second base part 64b and a bending part 64c connected between the first base part 64a and the second base part 64b. Wherein, the bending part 64c has a through hole H. On the other hand, the operating member 62 is movably mounted to the mounting base 64. For example, the mounting base 64 is arranged with a guiding feature 70, and the operating member 62 is movable relative to the mounting base 64 through the guiding feature 70. In the present embodiment, the mounting base 64 comprises the guiding feature 70, and the guiding feature 70 is a longitudinal passage, such that the operating member 62 is longitudinally movable relative to the mounting base 64 through the guiding feature 70. Preferably, the operating member 62 is configured to penetrate through the through hole H of the bending part 64c of the mounting base 64, and the operating member 62 comprises a first extending part 62a and a second extending part 62b respectively corresponding to the first base part 64a and the second base part 64b of the mounting base 64. Preferably, the first extending part 62a and the second extending part 62b of the operating member 62 comprise a first longitudinal elongated hole 72a and a second longitudinal elongated hole 72b respectively. Wherein, the first shaft member 68 passes through a portion of the first longitudinal elongated hole 72a to be pivoted to the first base part 64a of the mounting base 64. On the other hand, a second shaft member 74 passes through a portion of the second longitudinal elongated hole 72b and is connected to the second base part 64b of the mounting base 64. Preferably, one of the operating member 62 and the engaging member 60 has a guiding structure. In the present embodiment, the operating member 62 and the engaging member 60 respectively have a first guiding structure 76 and a second guiding structure 78 interacting with each other, and the first guiding structure 76 and the second guiding structure 78 have inclined surfaces or arc surfaces.

Figure 8:
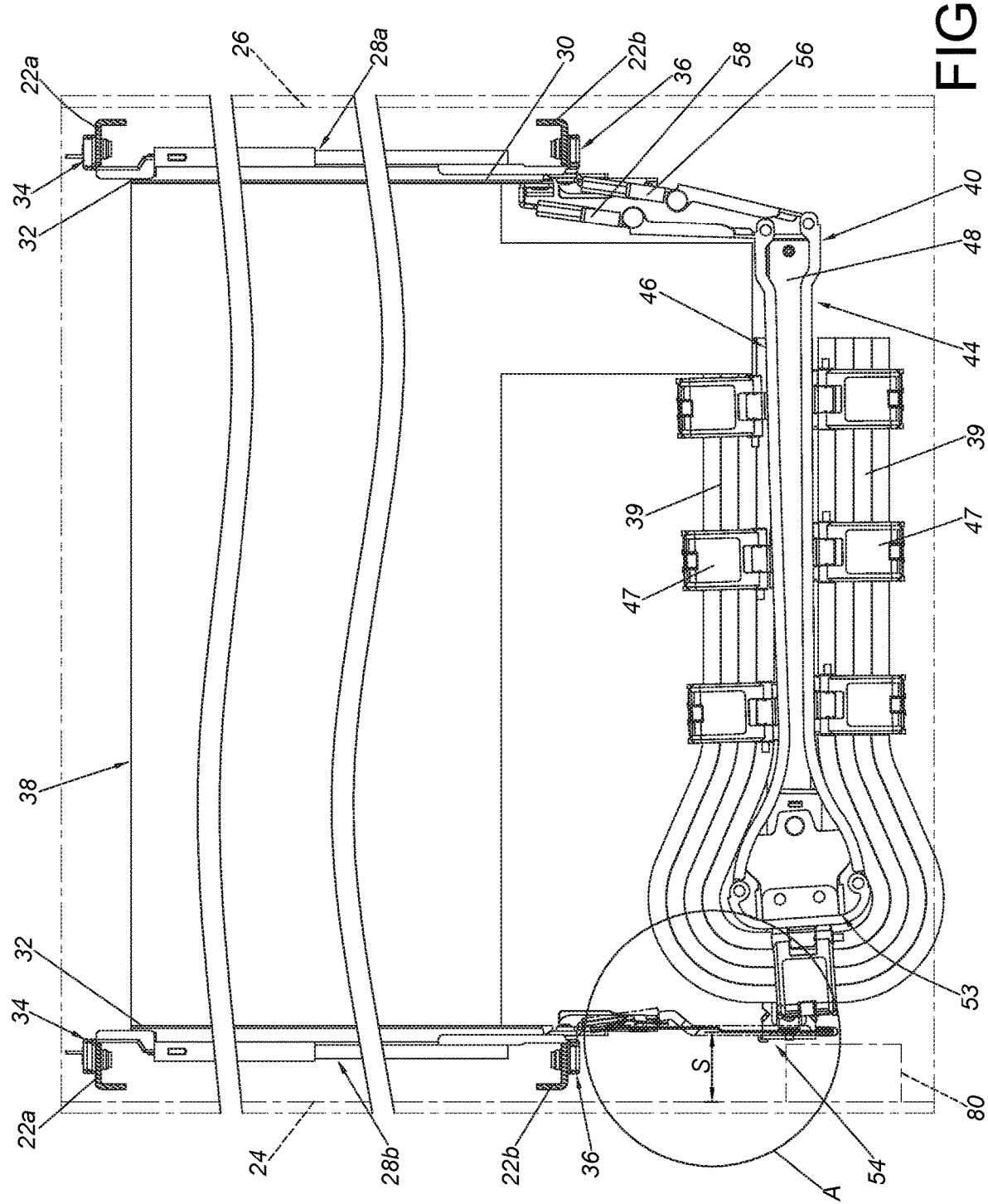
FIG. 8 is a diagram showing the cable management assembly in the first state being applied to the rack system according to an embodiment of the present invention.
Figure 9:
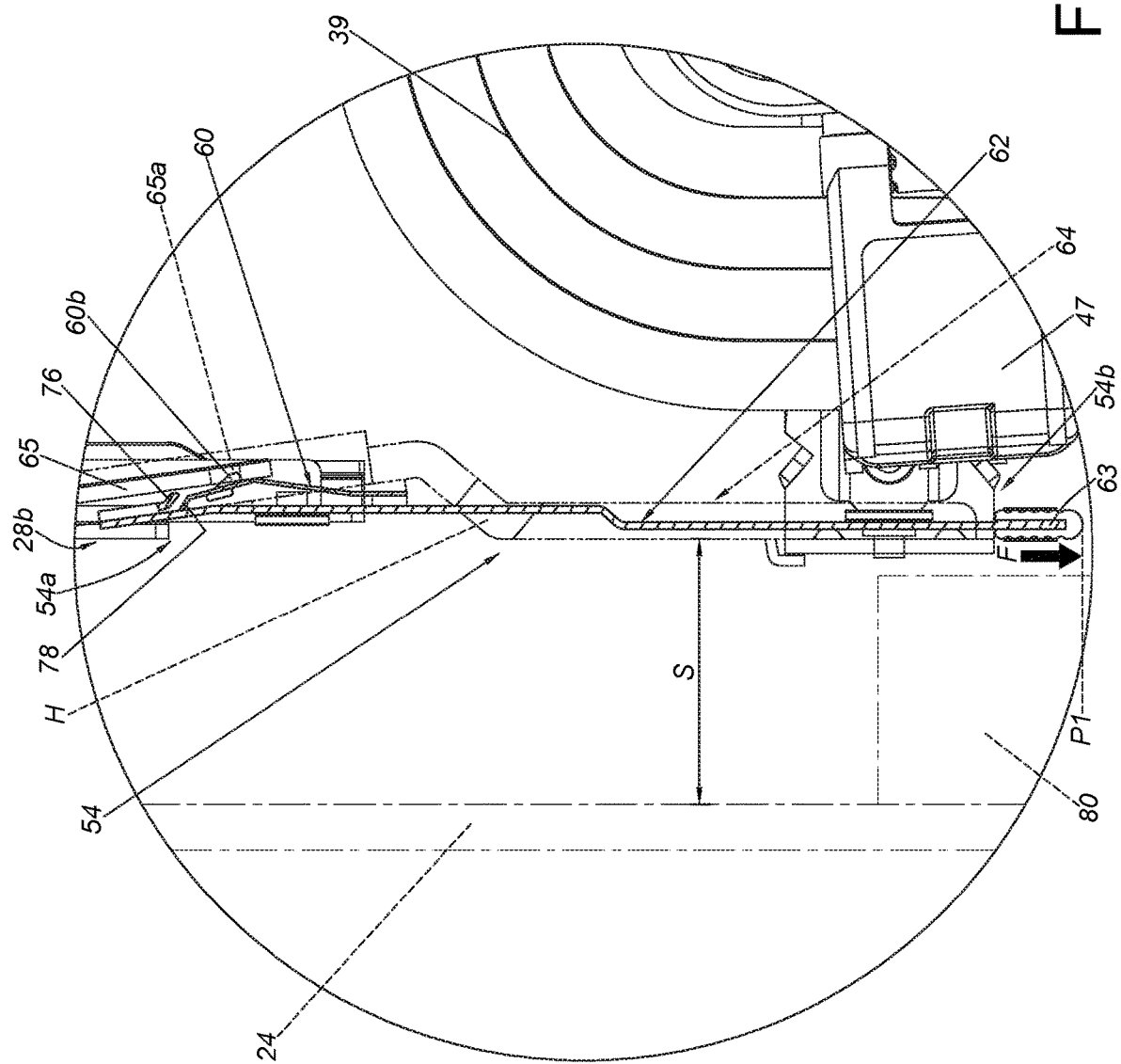
FIG. 9 is an enlarged view of an area A of FIG. 8 for showing the connecting device before being operated.

As shown in FIG. 8 and FIG. 9, the carried object 38 is retracted into the rack 22 relative to the first rails 30 through the second rails 32 of the first slide rail assembly 28a and the second slide rail assembly 28b. Wherein, a space S between the connecting device 54 and the first wall 24 of the rack 22 is limited (or narrow); or, for different requirements, the space S may be occupied by other related component 80; or, as shown in FIG. 2, each of the up-down arranged slide rail assemblies in the rack system has a predetermined specification height, such that the space is also limited by the specification height. However, operation of the connecting device 54 of the present embodiment is not affected by the aforementioned situations.

Moreover, when the first part 54a (such as the front part) of the connecting device 54 is connected to the connecting section 65 of the first rail 30 of the second slide rail assembly 28b and a user is going to detach the at least one supporting member 48 from the connecting section 65 of the first rail 30 of the second slide rail assembly 28b, the user can operate the second part 54b (such as the rear part) of the connecting device 54 to detach the first part 54a from the connecting section 65 of the first rail 30 of the second slide rail assembly 28b.

Figure 10:
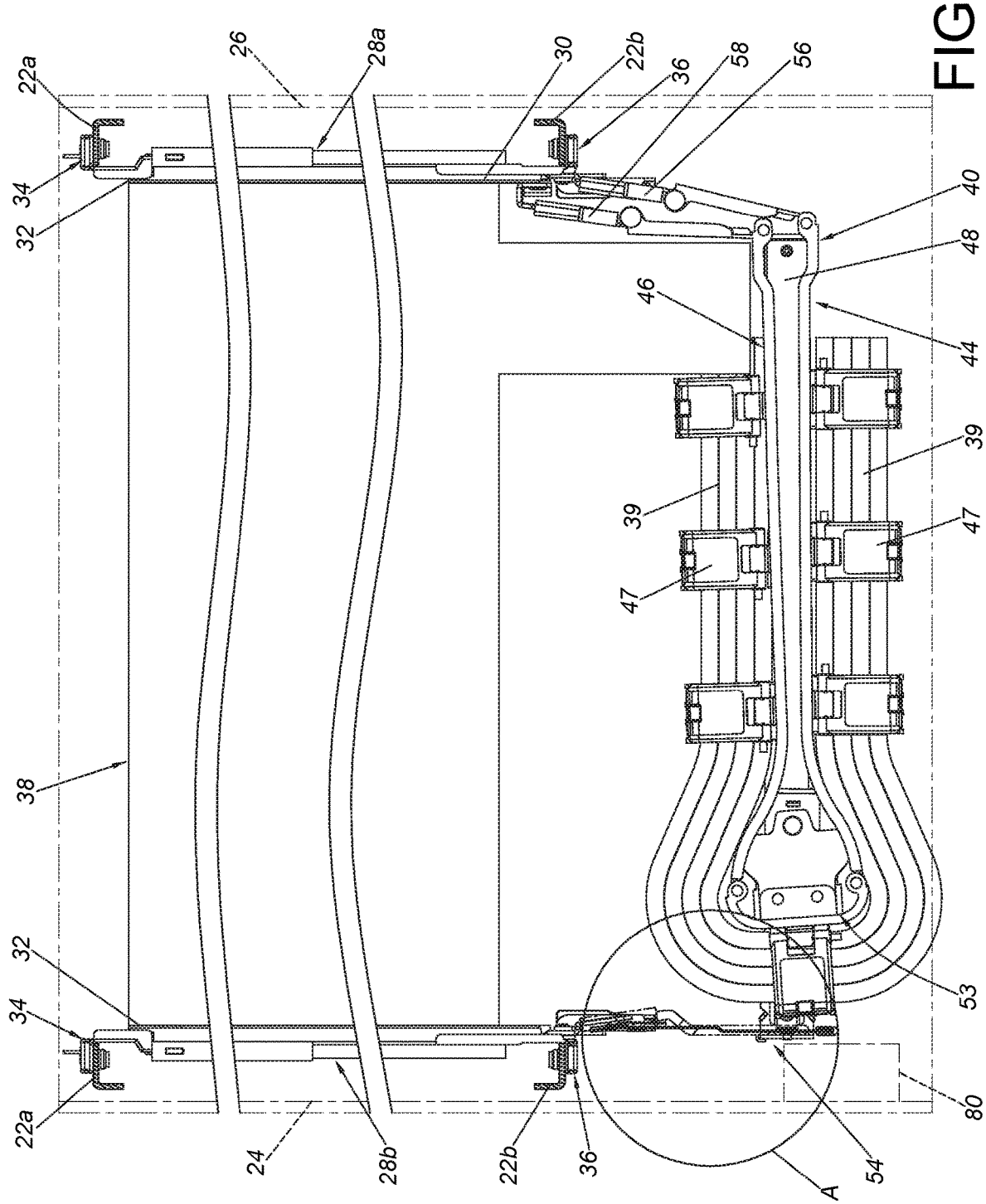
FIG. 10 is a diagram showing the cable management assembly in the first state being applied to the rack system according to an embodiment of the present invention.
Figure 11:
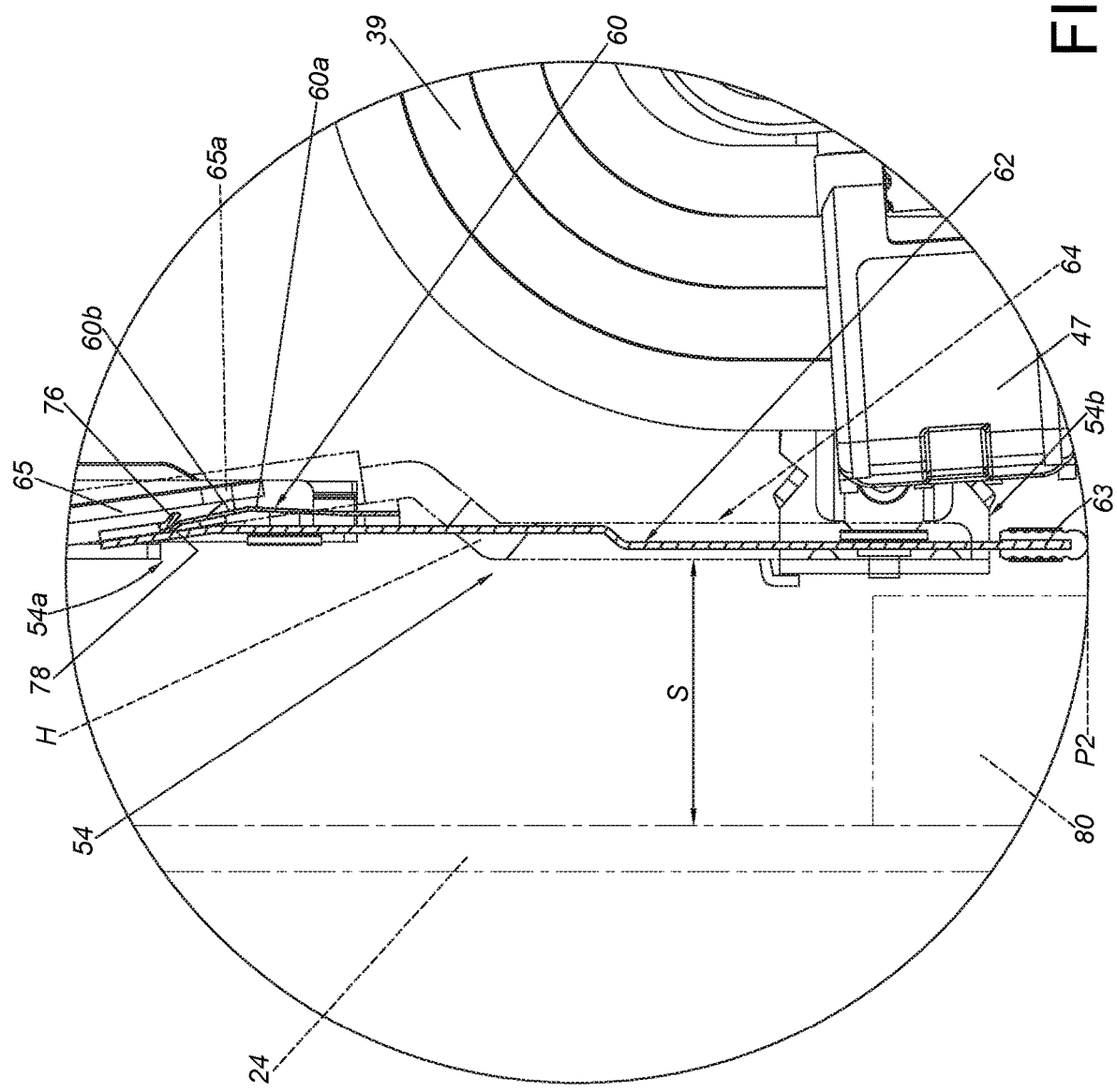
FIG. 11 is an enlarged view of an area A of FIG. 10 for showing the connecting device after being operated.

As shown in FIG. 9, the first part 54a of the connecting device 54 is configured to be engaged with the second structure 65a of the connecting section 65 of the first rail 30 of the second slide rail assembly 28b through the first structure 60b of the engaging member 60. On the other hand, the operating member 62 is located at a first predetermined position P1 relative to the mounting base 64. As shown in FIG. 10 and FIG. 11, the user can apply a force F to the operating part 63, such that the operating member 62 can be longitudinally moved relative to the mounting base 64 from the first predetermined position P1 (as shown in FIG. 9) to a second predetermined position P2 (as shown in FIG. 11). As such, the first guiding structure 76 and the second guiding structure 78 contact each other to further press the elastic part 60a, so as to disengage the first structure 60b of the engaging member 60 from the second structure 65a of the connecting section 65 of the first rail 30 of the second slide rail assembly 28b.

According to the embodiment of the present invention, the connecting device 54 allows the user to control the first part 54a (such as the front part) from the second part 54b (such as the rear part). Therefore, the second part 54b of the connecting device 54 is configured to be operated by the user to detach the first part 54a from a target object (such as the first rail 30 of the second slide rail assembly 28b). When the cable management assembly 40 is applied to the rack 22, the user standing behind the rack 22 can directly operate the second part 54b (such as the rear part) of the connecting device 54 to detach the first part 54a (such as the front part) from the first rail 30 of the second slide rail assembly 23b.

Figure 12:
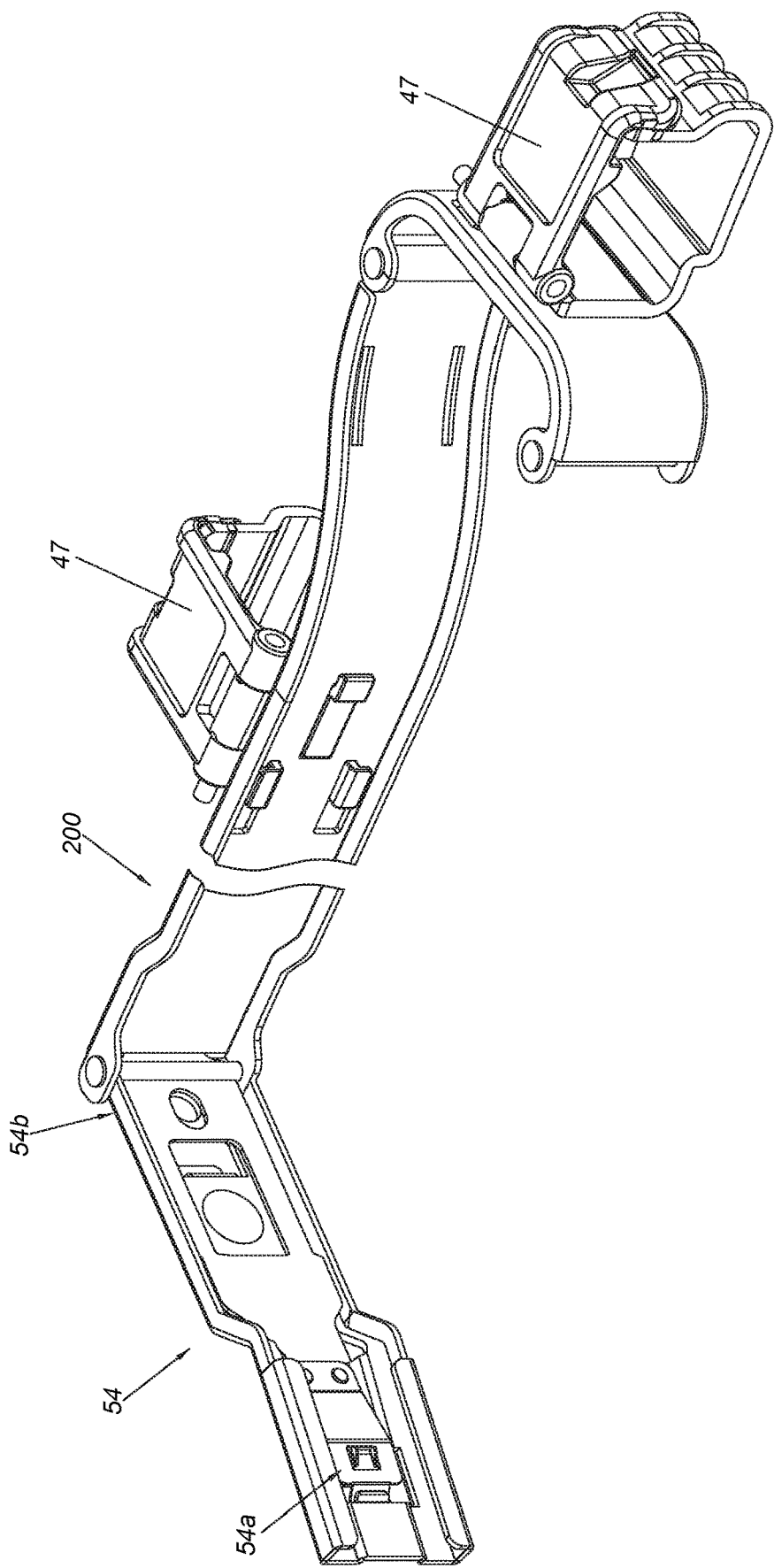
FIG. 12 is a diagram showing the connecting device of the cable management assembly according to a second embodiment of the present invention.

FIG. 12 is a diagram showing the connecting device 54 according to another embodiment of the present invention. Specifically, different from the connecting device 54 of the first embodiment being arranged on the at least one supporting member 48, the connecting device 54 of the present embodiment is applied to the cable management arm 200 (such as the first cable management arm or the second cable management arm). In particular, the connecting device 54 can replace the mounting member (such as the first mounting member 56 or the second mounting member 58). Therefore, the cable management arm 200 can be connected to the target object (such as a rail) through the connecting device 54. According to such arrangement, when the user is going to detach the cable management arm 200 from the target object (such as the rail), the connecting device 54 allows the user to control the first part 54a (such as the front part) from the second part 54b (such as the rear part), in order to detach the first part 54a (the front part) from the target object (such as the first rail 30 of the first slide rail assembly 28a).

Therefore, the cable management assembly of the present invention is characterized in that:

1. The second part 54b of the connecting device 54 can be operated by the user to control the first part 54a.

Figure 1:
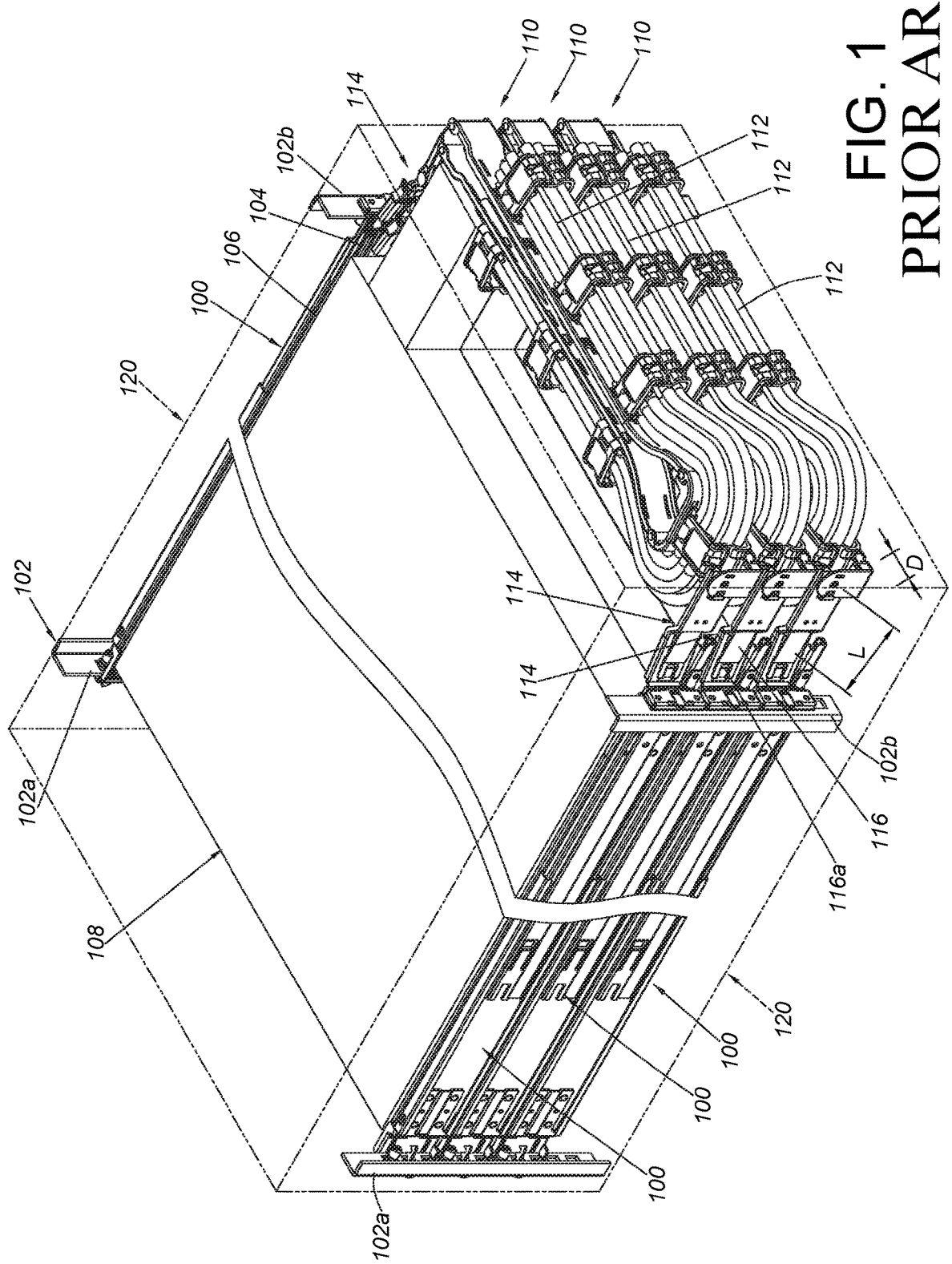
FIG. 1 is a diagram showing a cable management assembly of the prior art being applied to a rack system.

2. Different from the prior art in FIG. 1 where it is inconvenient for the user to press the operating part 116a from a lateral side of the connecting mechanism 114 due to the limited or narrow space D, the connecting device 54 of the embodiment of the present invention is configured to allow the user to operate the second part 54b (such as the rear part) to detach the first part 54a from the target object (such as the first rail 30 of the slide rail assembly).

3. When the cable management assembly is applied to the rack 22 where the space is limited or too narrow, the user standing behind the rack 22 can directly operate the second part 54b (such as the rear part) of the connecting device 54 to detach the first part 54a from the target object.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A cable management assembly, comprising:
a first cable management arm;
a second cable management arm, wherein each of the second cable management arm and the first cable management arm comprises a first end part and a second end part, and the first end parts of the first cable management arm and the second cable management arm are movably connected to each other; and
at least one supporting member;
wherein one of the at least one supporting member, the second end part of the first cable management arm and the second end part of the second cable management arm is arranged with a connecting device;
wherein the connecting device comprises a front part and a rear part, the front part of the connecting device is arranged with an engaging member, the front part is configured to be detachably connected to a first target object through the engaging member, the connecting device further comprises an operating member operatively connected to the engaging member, and the operating member has an operating part arranged adjacent to the rear part of the connecting device and configured to be operated to detach the engaging member from the first target object.

2. The cable management assembly of claim 1, wherein the at least one supporting member is configured to support one of the first cable management arm and the second cable management arm.

3. The cable management assembly of claim 1, wherein the first target object is a rail.

4. The cable management assembly of claim 1, wherein the other two of the at least one supporting member, the second end part of the first cable management arm and the second end part of the second cable management arm are respectively arranged with a first mounting member and a second mounting member configured to be detachably connected to a second target object and a third target object respectively.

5. The cable management assembly of claim 4, wherein the second target object and the third target object are rails.

6. The cable management assembly of claim 1, wherein the connecting device is arranged on the at least one supporting member through a base.

7. The cable management assembly of claim 6, wherein the base comprises a base part and a wall part, the base part is connected to the at least one supporting member and adjacent to one end of the at least one supporting member, the wall part is arranged vertically relative to the base part, and the connecting device is pivoted relative to the wall part.

8. The cable management assembly of claim 1, wherein the connecting device further comprises a mounting base, the operating member is movably mounted to the mounting base, and the operating member is configured to be operated through the operating part to longitudinally move relative to the mounting base.

9. The cable management assembly of claim 1, wherein the operating part of the operating member is extended beyond the rear part of the connecting device along a direction away from the front part of the connecting device.

10. A cable management assembly, comprising a connecting device; wherein the connecting device comprises a first part and a second part away from the first part, the first part of the connecting device is arranged with an engaging member, the first part is configured to be detachably engaged with a first target object through the engaging member, the connecting device further comprises an operating member operatively connected to the engaging member, and the operating member has an operating part arranged adjacent to the second part of the connecting device and configured to be operated to detach the engaging member from the first target object.

11. The cable management assembly of claim 10, wherein the first part and the second part are respectively a front part and a rear part of the connecting device.

12. The cable management assembly of claim 10, wherein the first target object is a rail of a slide rail assembly.

13. The cable management assembly of claim 12, further comprising a first cable management arm, a second cable management arm and at least one supporting member; wherein each of the second cable management arm and the first cable management arm comprises a first end part and a second end part, and the first end parts of the first cable management arm and the second cable management arm are pivotally connected to each other, the at least one supporting member is configured to support one of the first cable management arm and the second cable management arm, and the at least one supporting member is arranged with the connecting device.

14. The cable management assembly of claim 13, wherein the second end part of the first cable management arm and the second end part of the second cable management arm are respectively arranged with a first mounting member and a second mounting member configured to be connected to a second target object and a third target object.

15. The cable management assembly of claim 14, wherein the second target object and the third target object are two rails of another slide rail assembly, and the two rails are longitudinally movable relative to each other.

16. The cable management assembly of claim 13, wherein the connecting device is arranged on the at least one supporting member through a base, the base comprises a base part and a wall part, the base part is connected to the at least one supporting member and adjacent to one end of the at least one supporting member, the wall part is arranged vertically relative to the base part, and the connecting device is pivoted relative to the wall part.

17. A cable management assembly, applicable to a first slide rail assembly and a second slide rail assembly, each of the slide rail assemblies comprising a first rail and a second rail, the first rail being mounted to a rack, and the second rail being longitudinally movable relative to the first rail, the cable management assembly comprising:
a first cable management arm;
a second cable management arm, wherein each of the second cable management arm and the first cable management arm comprises a first end part and a second end part, the first end parts of the first cable management arm and the second cable management arm are pivotally connected to each other, the second end parts of the first cable management arm and the second cable management arm are respectively arranged with a first mounting member and a second mounting member configured to be detachably connected to the first rail and the second rail of the first slide rail assembly respectively; and
at least one supporting member arranged with a connecting device;
wherein the connecting device comprises a front part and a rear part, the front part of the connecting device is arranged with an engaging member, the front part is configured to be detachably connected to the first rail of the second slide rail assembly through the engaging member, the connecting device further comprises an operating member operatively connected to the engaging member, and the operating member has an operating part arranged adjacent to the rear part of the connecting device and configured to be operated to detach the engaging member from the first rail of the second slide rail assembly.

18. The cable management assembly of claim 17, wherein the at least one supporting member is configured to support one of the first cable management arm and the second cable management arm.

19. The cable management assembly of claim 18, wherein the connecting device is arranged on the at least one supporting member through a base, the base comprises a base part and a wall part, the base part is connected to the at least one supporting member and adjacent to one end of the at least one supporting member, the wall part is arranged vertically relative to the base part, the connecting device is arranged on the wall part, the connecting device further comprises a mounting base, the operating member is movably mounted to the mounting base, and the operating member is configured to be operated through the operating part to longitudinally move relative to the mounting base.

* * * * *